United States Patent
Zundel et al.

(10) Patent No.: US 9,006,798 B2
(45) Date of Patent: Apr. 14, 2015

(54) SEMICONDUCTOR DEVICE INCLUDING TRENCH TRANSISTOR CELL ARRAY AND MANUFACTURING METHOD

(71) Applicant: Infineon Technologies AG, Neubiberg (DE)

(72) Inventors: Markus Zundel, Egmating (DE); Manfred Schneegans, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/886,305

(22) Filed: May 3, 2013

(65) Prior Publication Data
US 2014/0327053 A1    Nov. 6, 2014

(51) Int. Cl.
*H01L 27/148* (2006.01)
*H01L 29/04* (2006.01)
*H01L 29/78* (2006.01)
*H01L 21/8234* (2006.01)

(52) U.S. Cl.
CPC .......... *H01L 29/045* (2013.01); *H01L 29/7827* (2013.01); *H01L 21/823487* (2013.01)

(58) Field of Classification Search
USPC .................................. 257/255, 330; 438/460
See application file for complete search history.

(56) References Cited

U.S. PATENT DOCUMENTS

2013/0214290 A1*   8/2013   Hayashi et al. ................. 257/77

\* cited by examiner

*Primary Examiner* — Long Pham
(74) *Attorney, Agent, or Firm* — Murphy, Bilak & Homiller, PLLC

(57) ABSTRACT

A semiconductor device includes a trench transistor cell array in a silicon semiconductor body with a first main surface and a second main surface opposite to the first main surface. A main lateral face of the semiconductor body between the first main surface and the second main surface has a first length along a first lateral direction parallel to the first and second main surfaces. The first length is equal or greater than lengths of other lateral faces of the semiconductor body. The trench transistor cell array includes predominantly linear gate trench portions. At least 50% of the linear gate trench portions extend along a second lateral direction or perpendicular to the second lateral direction. An angle between the first and second lateral directions is in a range of 45°±15°.

19 Claims, 5 Drawing Sheets log [gate trench length $\ell$]

SEMICONDUCTOR DEVICE INCLUDING TRENCH TRANSISTOR CELL ARRAY AND MANUFACTURING METHOD

BACKGROUND

One goal in the development of semiconductor components such as power semiconductor components lies in an improvement of the so-called specific on-resistance being the product of the on-resistance and the area of a device (Ron×A). When aiming at reducing the specific on-resistance individual contributions to the specific on-resistance have to be considered in conjunction with device reliability aspects caused by semiconductor processing.

Thus, there is a need for a semiconductor device which, among other advantages and features, meets demands on reduced specific on-resistance and reliability.

SUMMARY

In accordance with an embodiment, a semiconductor device includes a trench transistor cell array in a silicon semiconductor body with a first main surface and a second main surface opposite to the first main surface. A main lateral face of the semiconductor body between the first main surface and the second main surface has a first length along a first lateral direction parallel to the first and second main surfaces. The first length is equal or greater than lengths of other lateral faces of the semiconductor body. The trench transistor cell array includes predominantly linear gate trench portions and at least 50% of the linear gate trench portions extend along a second lateral direction or perpendicular to the second lateral direction. An angle between the first and second lateral directions being is in a range of 45°±15°.

In accordance with an another embodiment, a semiconductor device includes a trench transistor cell array in a semiconductor body with a first main surface and a second main surface opposite to the first main surface. A main lateral face of the semiconductor body between the first main surface and the second main surface has a first length along a first lateral direction parallel to the first and second main surfaces. The first length is equal or greater than lengths of other lateral faces of the semiconductor body. The trench transistor cell array includes predominantly linear gate trench portions and at least 50% of the linear gate trench portions extend along a second lateral direction or perpendicular to the second lateral direction. An angle between the first and second lateral directions being is in a range of 45°±15°.

In accordance with another embodiment, a method of manufacturing a semiconductor device including a trench transistor cell array includes forming at least 50% of gate trenches of the trench transistor cell array in a semiconductor wafer as linear gate trench portions extending along a second lateral direction or perpendicular to the second lateral direction. The method further includes dicing the semiconductor wafer into at least one semiconductor chip including the semiconductor device. Dicing includes forming a main lateral face of the at least one semiconductor chip along a first lateral direction. A length of the main lateral face along the first direction is equal to or greater than lengths of other lateral faces of the at least one semiconductor chip. An angle between the first and second lateral directions is adjusted in a range of 45°±15°.

Those skilled in the art will recognize additional features and advantages upon reading the following detailed description and viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding or similar parts.

DETAILED DESCRIPTION

Figure 1:
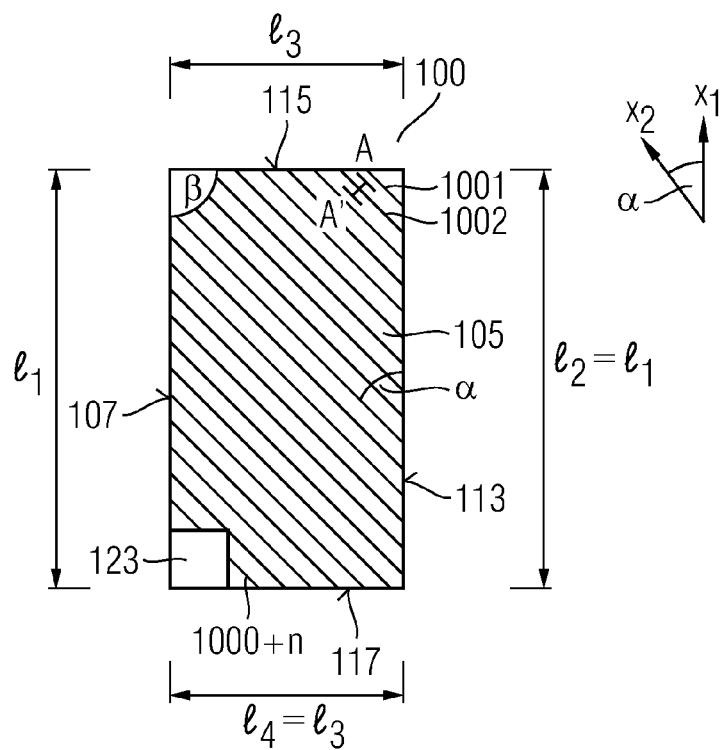
FIG. 1 is a schematic top view of a semiconductor body including parallel gate trench portions of a trench transistor cell array along a second lateral direction forming an angle α with a first direction along a main lateral face of the semiconductor body.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described as part of one embodiment can be used in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes are designated by the same references in the different drawings if not stated otherwise.

As employed in the specification, the term "electrically coupled" is not meant to mean that the elements must be directly coupled together. Instead, intervening elements may be provided between the "electrically coupled" elements. As an example, none, part, or all of the intervening element(s) may be controllable to provide a low-ohmic connection and, at another time, a non-low-ohmic connection between the "electrically coupled" elements. The term "electrically connected" intends to describe a low-ohmic electric connection between the elements electrically connected together, e.g., a connection via a metal and/or highly doped semiconductor.

Some Figures refer to relative doping concentrations by indicating "−" or "+" next to the doping type. For example, "$n^−$" means a doping concentration which is less than the doping concentration of an "n"-doping region while an "$n^+$"-doping region has a larger doping concentration than the "n"-doping region. Doping regions of the same relative doping concentration may or may not have the same absolute doping concentration. For example, two different $n^+$-doped regions can have different absolute doping concentrations. The same applies, for example, to an $n^−$-doped and a $p^+$-doped region. In the embodiments described below, a conductivity type of the illustrated semiconductor regions is denoted n-type or p-type, in more detail one of n-type, n-type, $n^+$-type, $p^−$-type, p-type and $p^+$-type. In each of the illustrated embodiments, the conductivity type of the illustrated semiconductor regions may be vice versa. In other words, in an alternative embodiment to any one of the embodiments described below, an illustrated p-type region may be n-type and an illustrated n-type region may be p-type.

Terms such as "first", "second", and the like, are used to describe various structures, elements, regions, sections, etc. and are not intended to be limiting. Like terms refer to like elements throughout the description.

The terms "having", "containing", "including", "comprising" and the like are open and the terms indicate the presence of stated elements or features, but not preclude additional elements or features. The articles "a", "an" and "the" are intended to include the plural as well as the singular, unless the context clearly indicates otherwise.

FIG. 1 is a schematic top view of a semiconductor device 100. According to an embodiment, the semiconductor device 100 is a discrete semiconductor device, e.g. a field effect transistor (FET) such as a power transistor. According to another embodiment, the semiconductor device 100 is an integrated circuit (IC) including a FET and additional analog circuit(s) and/or digital circuit(s) and/or mixed-signal circuit(s).

The semiconductor device 100 includes a trench transistor cell array in a silicon semiconductor body 105. The silicon semiconductor body 105 includes single-crystalline semiconductor material. According to an embodiment, the silicon semiconductor body 105 includes a crystalline silicon semiconductor substrate. On the crystalline silicon semiconductor substrate none, one or more optional semiconductor layer(s) may be arranged. The optional semiconductor layer(s) may be epitaxial semiconductor layer(s) grown or deposited on the silicon semiconductor substrate.

The silicon semiconductor body 105 includes a first main lateral face 107 between a first main surface, e.g. a front side of the semiconductor body 105 and a second main surface, e.g. a rear side of the semiconductor body 105. A drawing plane of FIG. 1 is parallel to the first and second main surfaces. The first main lateral face 107 has a first length $l_1$ along a first lateral direction $x_1$ parallel to the first and second main surfaces. The first length $l_1$ is equal or greater than lengths of other lateral faces of the semiconductor body 105. In the embodiment illustrated in FIG. 1, the first length $l_1$ of the first main lateral face 107 equals a length $l_2$ of a second main lateral face 113 opposite to the first main lateral face 107. A third length $l_3$ of a third lateral face 115 is smaller than the lengths $l_1$, $l_2$ of the first and second main lateral faces 107, 113. The third length $l_3$ of the third lateral face 115 equals a fourth length $l_4$ of a fourth lateral face 117 opposite to the third lateral face 115. According to the embodiment illustrated in FIG. 1 an angle β between the first and third lateral faces 107, 115 equals 90°. A shape of the semiconductor body 105 is rectangular. According to other embodiments, the angle β may differ from 90°.

The trench transistor cell array includes predominantly linear gate trench portions 1001, 1002 . . . (1000+n). According to an embodiment, the trench transistor cell array is a power trench transistor cell array and a number n of the liner gate trench portions 1001, 1002 . . . (1000+n) is in a range of 500 to 100000.

In the embodiment illustrated in FIG. 1 the linear gate trench portions 1001, 1002 . . . (1000+n) are stripe-shaped parallel gate trenches extending along a second lateral direction $x_2$. In the embodiment illustrated in FIG. 1 the angle α equals 45°. According to other embodiments, the angle α differs from 45° and is in a range of 45°±15°.

According to an embodiment, the first lateral direction $x_1$ is parallel to a {110} plane where {110} denotes the family of planes equivalent to (110) by the symmetry of the lattice of the silicon semiconductor body 105. Silicon has the basic diamond crystal structure of two merged face-centered cubic cells displaced relative to each other. The notation of orientation of a surface or a crystal plane herein follows the notation system of Miller indices which is based on a consideration of how a plane, or indeed any parallel plane, intersects a main crystallographic axes of a solid.

According to an embodiment, the first main lateral face 107 is a {110} plane where {110} planes in silicon are characterized by a low fracture strength compared with planes of a different orientation such as {100}. Thus, damage at the main lateral face 107 of the semiconductor body 105 due to chip dicing can be reduced. Consequently, decline of device reliability caused by damage of the main lateral face 107 of the semiconductor body 105 can be reduced.

According to an embodiment, a thickness of the semiconductor body 105 is in a range of 20 μm to 120 μm. When reducing the thickness of the semiconductor body 105, damage due to chip dicing at lateral faces should be considered with respect to device reliability.

According to the embodiment illustrated in FIG. 1, sidewalls of the linear gate trench portions 1001, 1002 . . . (1000+n) are parallel to or coincide with {100} planes or slightly deviate therefrom due to a taper caused by trench processing, e.g. trench etching. Since a channel region at an interface between a body region of the trench transistor cells and a gate dielectric of the trench transistor cells is, consequently, also parallel to {100} planes, a high charge carrier mobility due to low surface density along {100} planes can be achieved. Thus, the specific on-resistance can be reduced.

The embodiment illustrated in FIG. 1 allows for a joint improvement of the specific on-resistance and reliability by combined improvement of chip dicing and channel resistance. The above embodiment may also be applied to other semiconductor bodies than silicon, provided that crystal planes of low fracture strength and high charge carrier mobility differ from each other.

According to an embodiment, lengths of the linear gate trench portions 1001, 1002 . . . (1000+n) range from less than 100 µm to greater than 1 mm. In view of the angle α between the first and second lateral directions $x_1$, $x_2$ a wide range of gate trench lengths results.

The semiconductor device 100 further includes a contact pad 123 at the first main surface. The contact pad 123 is a conductive area, e.g. an area including metal layer(s) and may serve as a bonding pad. According to an embodiment, the contact pad 123 is one of a gate pad, a source pad, a drain pad and a contact pad for device measurement/testing.

Figure 2:
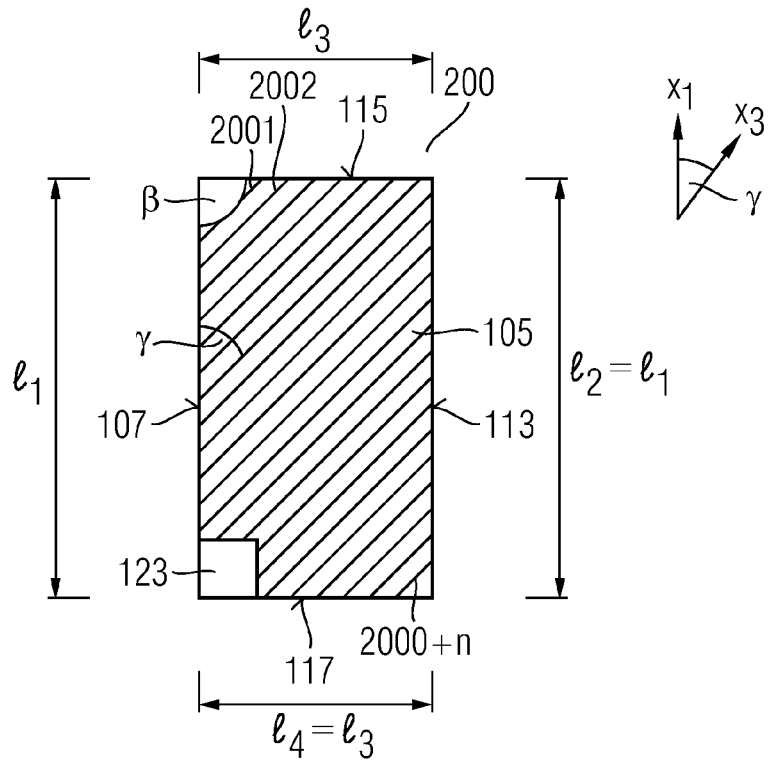
FIG. 2 is a schematic top view of a semiconductor body including parallel gate trench portions of a transistor cell array along a direction perpendicular to the second direction illustrated in FIG. 1.

FIG. 2 is a schematic top view of a semiconductor device 200 according to an embodiment.

The semiconductor device 200 includes linear gate trench portions 2001, 2002 . . . 2000+n which are parallel and extend along a third lateral direction $x_3$ in the embodiment illustrated in FIG. 2. An angle γ between the first and third directions $x_1$, $x_3$ is perpendicular to the second lateral direction $x_2$ illustrated in FIG. 1 and is in a range of 45°±1°. According to other embodiments, the angle γ may differ from 45° and falls in a range of 45°±15°, i.e. 30° to 60°.

According to an embodiment, the angle γ in the embodiment illustrated in FIG. 2 or the angle α in the embodiment illustrated in FIG. 1 is chosen in the range of 30° to 60° such that a high charge carrier mobility in a channel region at an interface between a gate dielectric and a body region is achieved while chip dicing occurs along a crystal plane having a lower fraction strength with respect to other crystal planes.

Figure 3:
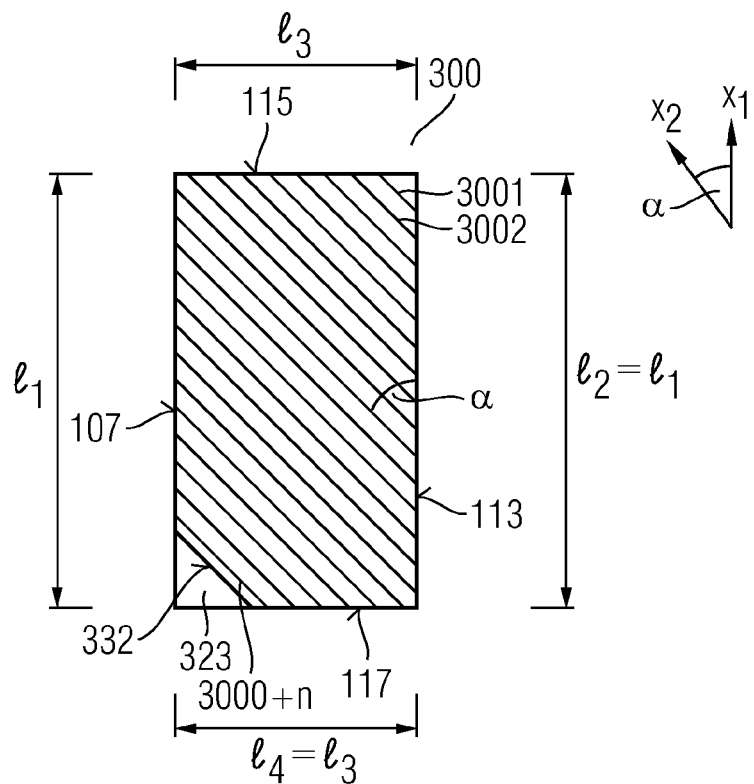
FIG. 3 is a schematic top view of a semiconductor body including parallel gate trench portions of a transistor cell array along the second lateral direction and a chamfered device pad including an edge extending along the second lateral direction.

FIG. 3 is a schematic top view of a semiconductor device 300 according to an embodiment.

Similar to the semiconductor device 100 illustrated in FIG. 1, the semiconductor device 300 includes linear gate trench portions 3001, 3002 . . . (3000+n) which are parallel and extend along the second lateral direction $x_2$. The semiconductor device 300 further includes a chamfered contact pad 323 including an edge 332 along the second lateral direction $x_2$. Thus, the linear gate trench portion (3000+n) having a smallest distance to the edge 332 with respect to the other linear gate trench portions 3001, 3002 . . . (3000+n) extends parallel to the edge 332. Thereby, gate trench terminations due to arrangement of contact pad(s) may be minimized.

Figure 4:
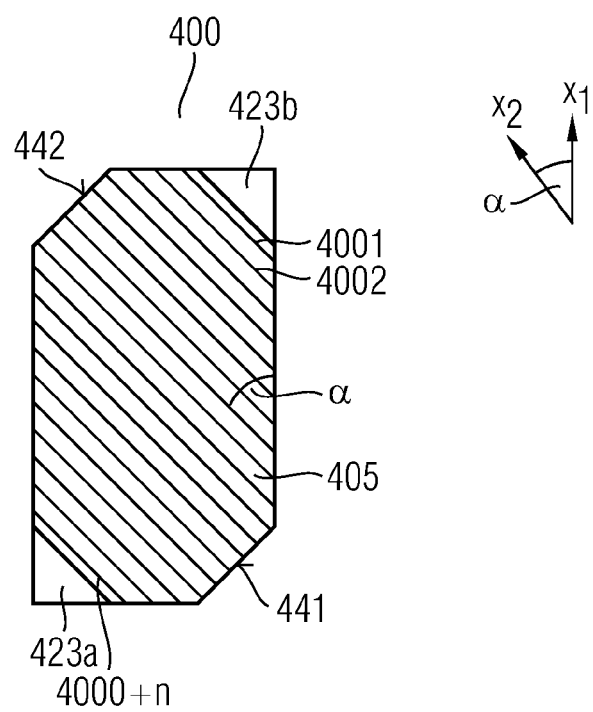
FIG. 4 is a schematic top view of a semiconductor body including parallel gate trench portions of a transistor cell array along the second lateral direction, chamfered device pads at diagonally opposite corners of the semiconductor body as well as diagonally opposite chamfered corners of the semiconductor body.

FIG. 4 is a schematic top view of a semiconductor device 400 according to another embodiment. Similar to the semiconductor device 300 illustrated in FIG. 3, the semiconductor device 400 includes linear gate trench portions 4001, 4002 . . . (4000+n) in a semiconductor body 405 extending along the second lateral direction $x_2$. The semiconductor device 400 further includes contact pads 423a, 423b. Each of the contact pads 423a, 423b includes an edge extending along the second lateral direction $x_2$ parallel to the linear gate trench portions 4001, 4002 . . . (4000+n) in the semiconductor body 405. Similar to the embodiment illustrated in FIG. 3, gate trench terminations due to arrangement of contact pad(s) may be minimized.

The semiconductor body 405 includes diagonally opposite chamfered corners 441, 442. The chamfered corners 441, 442 reduce or counteract electric field peaks and/or stress in that area.

Figure 5:
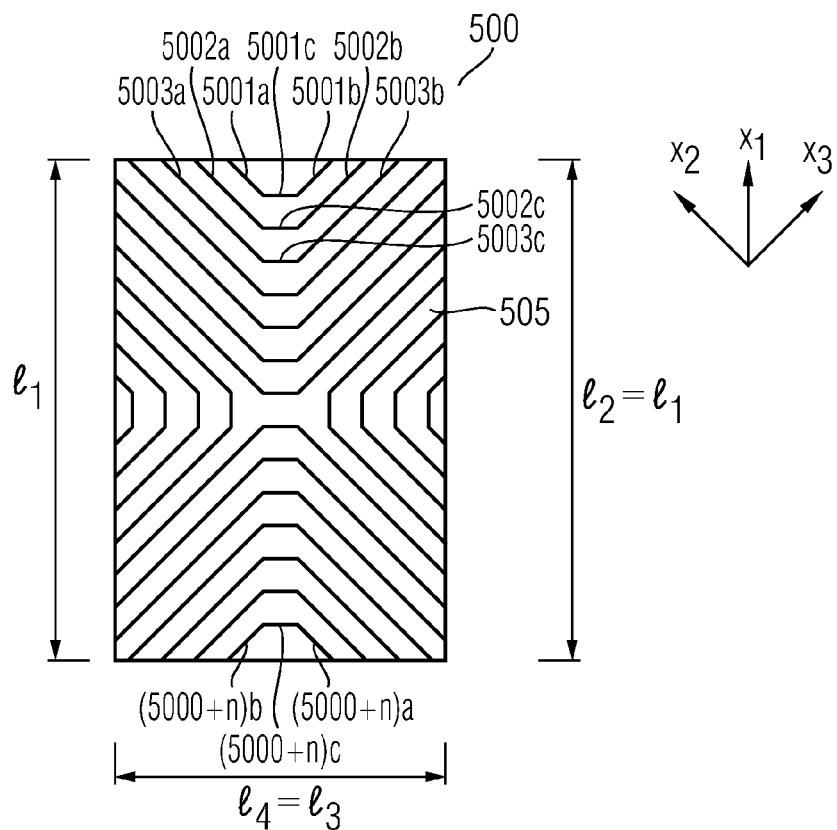
FIG. 5 illustrates a schematic top view of a semiconductor body including parallel gate trench portions of a transistor cell array predominantly along the second lateral direction and along a third lateral direction perpendicular to the second lateral direction.

FIG. 5 is a schematic top view of a semiconductor device 500 according to another embodiment. The semiconductor device 500 includes first linear gate trench portions 5001a, 5002a . . . (5000+n)a extending along the second direction $x_2$ in a semiconductor body 505. Second linear gate trench portions 5001b, 5002b . . . (5000+n)b extend along the third direction $x_3$ perpendicular to the second direction $x_2$. The first and second linear gate trench portions 5001a, 5002a . . . (5000+n)a, 5001b, 5002b . . . (5000+n)b are merged by intermediate linear gate trench portions 5001c, 5002c . . . (5000+n)c.

According to the embodiment illustrated in FIG. 5, between 40% and 50% of the overall linear gate trench portions, i.e. linear gate trench portions 5001a, 5002a . . . (5000+n)a, 5001b, 5002b . . . (5000+n)b, 5001c, 5002c . . . (5000+n)c extend along the second direction $x_2$ and between 40% and 50% of the overall linear gate trench portions extend along the third direction $x_3$ perpendicular to the second direction $x_2$.

Figure 6:
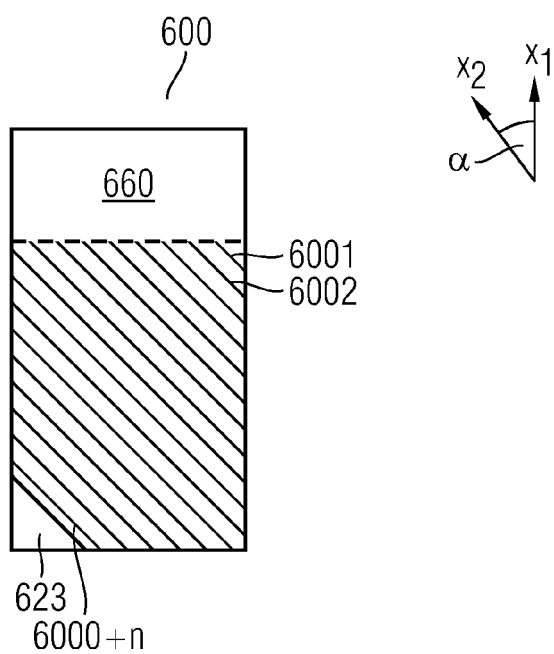
FIG. 6 illustrates a schematic top view of a semiconductor body including parallel gate trench portions of a transistor cell array along the second lateral direction and an electronic circuit including analog circuit(s) and/or digital circuit(s) and/or mixed-signal circuit(s).

FIG. 6 is a schematic top view of a semiconductor device 600 according to another embodiment. The semiconductor device 600 includes a transistor cell array having linear gate trench portions 6001, 6002 . . . 6000+n extending along the second direction $x_2$ similar to the semiconductor devices described with respect to the embodiments above. The semiconductor device 600 further includes an electronic circuit 660. The electronic circuit 660 includes analog circuit(s) and/or digital circuit(s) and/or mixed-signal circuit(s). The semiconductor device 600 is an integrated circuit. Structural features of the embodiments above may be combined and/or interchanged. As an example, a chamfered contact pad 623 of the semiconductor device 600 may differ in shape and the semiconductor device 600 may include additional contact pad(s).

Figure 7A:
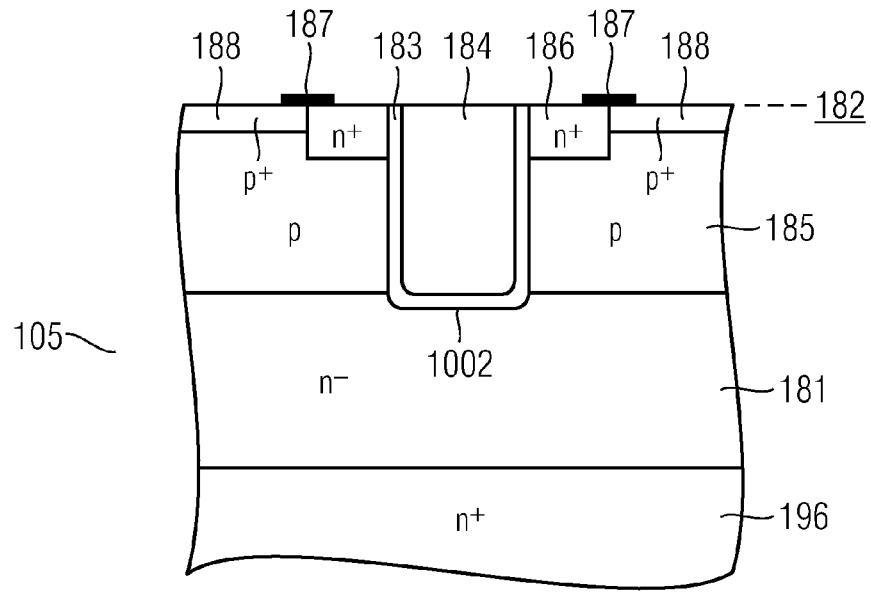
FIG. 7A illustrates one example of a cross-sectional view through the gate trenches illustrated in FIGS. 1 to 6.

FIG. 7A illustrates a first example of a cross-sectional view along a cut line A-A' of the transistor cell array illustrated in FIG. 1.

A transistor cell includes an $n^-$-doped drift zone 181 as part of the semiconductor body 105. The semiconductor body 105 further includes a highly doped substrate, e.g. an $n^+$-doped substrate 196. A gate trench 1002 extends into the semiconductor body 105 from a first main surface 182. A gate dielectric 183 lines sidewalls and a bottom side of the gate trench 1002. The gate dielectric 183 is arranged between a gate electrode 184 in the gate trench 1002 and a p-doped body region 185.

An $n^+$-doped source region 186 adjoins the gate trench 1002 at the first main surface 182. A conductivity in a channel region between the $n^+$-doped source region 186 and the $n^-$-doped drift region 181 that is located at an interface between the p-doped body region 185 and the gate dielectric 183 can be controlled via a voltage applied to the gate electrode 184. The p-doped body region 185 and the $n^+$-doped source region 186 are electrically coupled to a contact 187 at the first main surface 182. An optional $p^+$-doped body contact zone 188 may improve a low-resistive or ohmic contact to the contact 187.

The trench transistor cell illustrated in FIG. 7A is one example of a trench transistor cell and may be applied to any of the embodiments described herein.

Figure 7B:
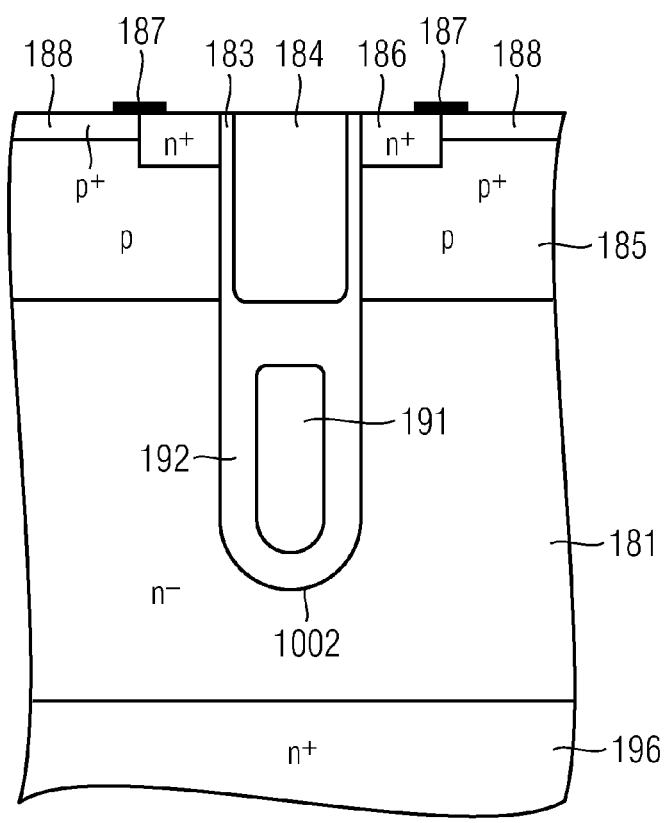
FIG. 7B illustrates another example of a cross-sectional view through the gate trenches illustrated in FIGS. 1 to 6.

FIG. 7B illustrates another example of a cross-sectional view through the linear gate trench portion 1002 illustrated in FIG. 1. The example illustrated in FIG. 7B differs from the example illustrated in FIG. 7A in that the gate trench 1002 includes a field electrode 191 below the gate electrode 184. A field dielectric 192 surrounds the field electrode 191 and is merged with the gate dielectric 183.

Figure 8:
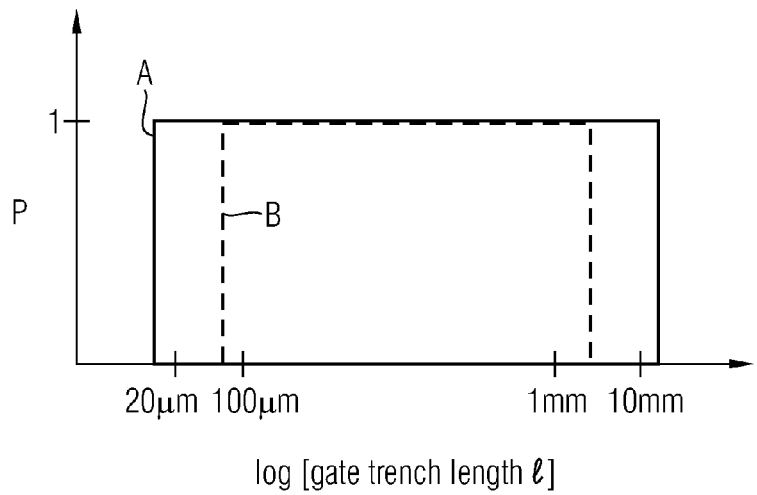
FIG. 8 illustrates a schematic diagram of lengths of the parallel gate trench portions according to an embodiment.

FIG. 8 illustrates a schematic diagram of a spreading probability p of lengths of the linear gate trench portions 1001, 1002 . . . 1000+n of the embodiment illustrated in FIG. 1. The spreading probability p also applies to other embodiments described herein.

The spreading probability p equals one if the transistor cell array includes at least one linear gate trench portion having a length of 1±1%. According to a first embodiment illustrated by curve A the transistor cell array includes gate trench lengths from smaller than 20 μm to greater than 10 mm. According to another embodiment illustrated by curve B the spreading probability p of lengths of the linear gate trench portions 1001, 1002 . . . 1000+n range from smaller than 100 μm to greater than 1 mm.

The angle α between the first and second directions $x_1$, $x_2$ causes a large spreading of the lengths of the linear gate trench portions 1001, 1002 . . . 1000+n.

Figure 9:
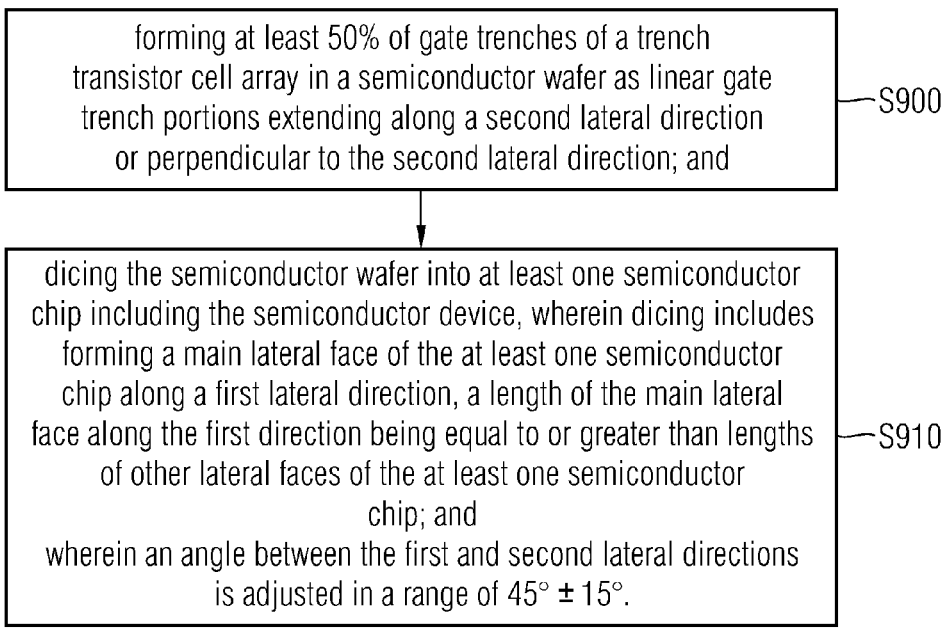
FIG. 9 is schematic flowchart of one embodiment of a method of manufacturing a semiconductor device.

FIG. 9 illustrates a schematic process flow in accordance with an embodiment of manufacturing a semiconductor device.

Process feature S900 includes forming at least 50% of gate trenches of a trench transistor cell array in a semiconductor wafer as linear gate trench portions extending along a second lateral direction or perpendicular to the second lateral direction.

Process feature S910 includes dicing the semiconductor wafer into at least one semiconductor chip including the semiconductor device, wherein dicing includes forming a main lateral face of the at least one semiconductor chip along a first lateral direction, a length of the lateral face along the first direction being equal or greater than lengths of other lateral faces of the at least one semiconductor chip. The angle between the first and second lateral directions is adjusted in a range of 45°±15°.

According to an embodiment, the semiconductor wafer is a silicon wafer. According to other embodiments, the semiconductor wafer is made of a material other than silicon provided that crystal planes of low fracture strength and high charge carrier mobility differ from each other.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a trench transistor cell array in a silicon semiconductor body with a first main surface and a second main surface opposite to the first main surface; and
   a main lateral face of the semiconductor body between the first main surface and the second main surface having a first length along a first lateral direction parallel to the first and second main surfaces,
   wherein the first length is equal or greater than lengths of other lateral faces of the semiconductor body,
   wherein the trench transistor cell array includes predominantly linear gate trench portions, and at least 50% of the linear gate trench portions extend along a second lateral direction or perpendicular to the second lateral direction, an angle between the first and second lateral directions being in a range of 45°±15°,
   wherein the semiconductor device is a discrete power transistor having an area of the trench transistor cell array of at least 0.5 mm².

2. The semiconductor device of claim 1, wherein a thickness of the semiconductor body is in a range of 120 μm to 20 μm.

3. The semiconductor device of claim 1, wherein the angle is 45°±1°.

4. The semiconductor device of claim 1, wherein the first lateral direction and a {110} plane of the silicon semiconductor body are parallel.

5. The semiconductor device of claim 1, wherein the main lateral face and a {110} plane of the silicon semiconductor body are parallel or coincident.

6. The semiconductor device of claim 1, wherein the second lateral direction and a {100} plane of the silicon semiconductor body are parallel.

7. The semiconductor device of claim 1, wherein a lateral face of gate trenches of the trench transistor cell array and a {110} plane of the silicon semiconductor body are parallel or coincident.

8. The semiconductor device of claim 1, wherein the linear gate trench portions include a plurality of distinct and parallel gate trenches.

9. The semiconductor device of claim 8, wherein the parallel gate trenches are stripe-shaped.

10. The semiconductor device of claim 8, wherein a number of the parallel gate trenches is in a range of 500 to 100000.

11. The semiconductor device of claim 8, wherein lengths of the parallel gate trenches range from less than 100 μm to greater than 1 mm.

12. The semiconductor device of claim 1, wherein at least 50% of the parallel gate trenches have different lengths.

13. The semiconductor device of claim 1, wherein at least 80% of the linear gate trench portions extend along the second direction.

14. The semiconductor device of claim 1, wherein 40% to 50% of the linear gate trench portions extend along the second direction and 40% to 50% of the linear gate trench portions extend perpendicular to the second direction.

15. The semiconductor device of claim 1, wherein the silicon semiconductor body includes at least one chamfered corner.

16. The semiconductor device of claim 1, further comprising a contact pad having an edge extending along the second lateral direction.

17. The semiconductor device of claim 1, wherein the semiconductor device is an integrated circuit including a power transistor circuit block having an area of at least 0.5 mm2 occupied with the trench transistor cell array.

18. A semiconductor device, comprising:
   a trench transistor cell array in a silicon semiconductor body with a first main surface and a second main surface opposite to the first main surface;
   a main lateral face of the semiconductor body between the first main surface and the second main surface having a first length along a first lateral direction parallel to the first and second main surfaces, the first length being equal or greater than lengths of other lateral faces of the semiconductor body,
   wherein the trench transistor cell array includes predominantly linear gate trench portions, and at least 50% of the linear gate trench portions extend along a second lateral direction or perpendicular to the second lateral direction, an angle between the first and second lateral directions being in a range of 45°±15°,
   wherein the second lateral direction and a {100} plane of the silicon semiconductor body are parallel.

19. A semiconductor device, comprising:
- a trench transistor cell array in a silicon semiconductor body with a first main surface and a second main surface opposite to the first main surface;
- a main lateral face of the semiconductor body between the first main surface and the second main surface having a first length along a first lateral direction parallel to the first and second main surfaces, the first length being equal or greater than lengths of other lateral faces of the semiconductor body,
- wherein the trench transistor cell array includes predominantly linear gate trench portions, and at least 50% of the linear gate trench portions extend along a second lateral direction or perpendicular to the second lateral direction, an angle between the first and second lateral directions being in a range of 45°±15°,
- wherein the semiconductor device is an integrated circuit including a power transistor circuit block having an area of at least 0.5 mm$^2$ occupied with the trench transistor cell array.

* * * * *